United States Patent
Wu et al.

(10) Patent No.: US 11,145,659 B1
(45) Date of Patent: Oct. 12, 2021

(54) SEMICONDUCTOR STRUCTURE AND METHOD OF FORMING THE SAME

(71) Applicant: NANYA TECHNOLOGY CORPORATION, New Taipei (TW)

(72) Inventors: Yen-Ching Wu, Changhua County (TW); Rou-Wei Wang, Taipei (TW); Shuo Jia, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/876,142

(22) Filed: May 18, 2020

(51) Int. Cl.
*H01L 27/108* (2006.01)
*H01L 49/02* (2006.01)

(52) U.S. Cl.
CPC .... *H01L 27/1085* (2013.01); *H01L 27/10805* (2013.01); *H01L 28/60* (2013.01)

(58) Field of Classification Search
None
See application file for complete search history.

(56) References Cited

U.S. PATENT DOCUMENTS

| 2012/0329236 A1* | 12/2012 | Ueda | H01L 28/91 438/381 |
| 2015/0357249 A1* | 12/2015 | Kawabata | H01J 37/32834 438/14 |
| 2019/0051600 A1* | 2/2019 | Oh | H01L 21/76805 |

FOREIGN PATENT DOCUMENTS

| TW | 200527585 A | 8/2005 |
| TW | 202002270 A | 1/2020 |
| TW | 202015216 A | 4/2020 |
| TW | 202017160 A | 5/2020 |

* cited by examiner

*Primary Examiner* — Anthony Ho
*Assistant Examiner* — Kevin Quinto
(74) *Attorney, Agent, or Firm* — CKC & Partners Co., LLC

(57) ABSTRACT

A method of forming a semiconductor structure includes following steps. A substrate is formed. The substrate has an active region, an isolation structure adjacent to the active region, and a contact on the active region. A dielectric stack is formed on the substrate. The dielectric stack is etched to form an opening such that the contact of the substrate is exposed. The opening has a bottom portion and a top portion communicated to the bottom portion. The dielectric stack is etched again to expand the bottom portion of the opening.

16 Claims, 5 Drawing Sheets

SEMICONDUCTOR STRUCTURE AND METHOD OF FORMING THE SAME

BACKGROUND

Technical Field

The present disclosure relates to a semiconductor structure and a method of forming the semiconductor structure.

Description of Related Art

Capacitors are used in a wide variety of semiconductor circuits. For example, the capacitors are used in DRAM (dynamic random access memory) memory circuits or any other type of memory circuit. DRAM memory circuits are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor.

The development of the semiconductor circuits is to achieve larger capacitance, and thus an opening in a dielectric stack needs a smaller width. However, a problem of under-etch may occur when etching the dielectric stack to form the opening. On the other hand, in order to avoid the problem of under-etch, the opening may be formed larger, and adversely causes the problem of short-circuit.

SUMMARY

One aspect of the present disclosure is a method of forming a semiconductor structure.

According to some embodiments of the present disclosure, a method of forming a semiconductor structure includes following steps. A substrate is formed. The substrate has an active region, an isolation structure adjacent to the active region, and a contact on the active region. A dielectric stack is formed on the substrate. The dielectric stack is etched to form an opening such that the contact of the substrate is exposed. The opening has a bottom portion and a top portion communicated to the bottom portion. The dielectric stack is etched again to expand the bottom portion of the opening.

In some embodiments, the method of forming a semiconductor structure further includes filling a conductive material in the opening to form a conductive structure.

In some embodiments, the conductive structure is in contact with the contact of the substrate.

In some embodiments, forming the dielectric stack includes forming a first oxide structure over the substrate and forming a second oxide structure over the first oxide structure.

In some embodiments, etching the dielectric stack again to expand the bottom portion of the opening includes etching the first oxide structure of the dielectric stack.

In some embodiments, forming the dielectric stack includes forming a first nitride structure over the substrate, forming a second nitride structure over the first oxide structure, and forming a third nitride structure over the second oxide structure.

In some embodiments, forming the second nitride structure over the first oxide structure is performed such that the first oxide structure is between the first nitride structure and the second nitride structure.

In some embodiments, forming the third nitride structure over the second oxide structure is performed such that the second oxide structure is between the second nitride structure and the third nitride structure.

In some embodiments, etching the dielectric stack again to expand the bottom portion of the opening includes exposing a top surface of the first nitride structure.

In some embodiments, etching the dielectric stack again to expand the bottom portion of the opening includes exposing a bottom surface of the second nitride structure.

In some embodiments, the bottom portion of the opening is surrounded by the first oxide structure and the top portion of the opening is surrounded by the second oxide structure, and etching the dielectric stack again to expand the bottom portion of the opening is performed such that a top region of the bottom portion of the opening is wider than a bottom region of the top portion of the opening.

In some embodiments, etching the dielectric stack to form the opening is performed by dry etching.

In some embodiments, the dielectric stack is etched again using an etching gas including hydrogen fluoride (HF).

In some embodiments, etching the dielectric stack again to expand the bottom portion of the opening is performed such that the expanded opening has a double inverted trapezoid profile.

Another aspect of the present disclosure is a semiconductor structure.

According to some embodiments of the present disclosure, a semiconductor structure includes a substrate, a dielectric stack, and a conductive structure. The substrate has an action region, an isolation structure adjacent to the active region, and a contact on the active region. The dielectric stack is disposed on the substrate. The conductive structure is surrounded by the dielectric stack. The conductive structure has a bottom portion and a top portion on to the bottom portion, and a top region of the bottom portion of the conductive structure is wider than a bottom region of the top portion of the conductive structure.

In some embodiments, the dielectric stack further includes a first oxide structure and a second oxide structure. The first oxide structure is disposed over the substrate. The second oxide structure is disposed over the first oxide structure.

In some embodiments, the bottom portion of the conductive structure is surrounded by the first oxide structure, and the top portion of the conductive structure is surrounded by the second oxide structure.

In some embodiments, the dielectric stack further includes a first nitride structure, a second nitride structure, and a third nitride structure. The first nitride structure is disposed over the substrate. The second nitride structure is disposed over the first nitride structure. The third nitride structure is disposed over the second nitride structure.

In some embodiments, the first oxide structure is between the first nitride structure and the second nitride structure, and the second oxide structure is between the second nitride structure and the third nitride structure.

In some embodiments, the first oxide structure and the second oxide structure are made of different materials.

In the aforementioned embodiments, since the dielectric stack is etched again to expand the bottom portion of the opening, the problems of under-etch and short-circuit can be avoided. As a result, the capacitance of the semiconductor structure can be increased and the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
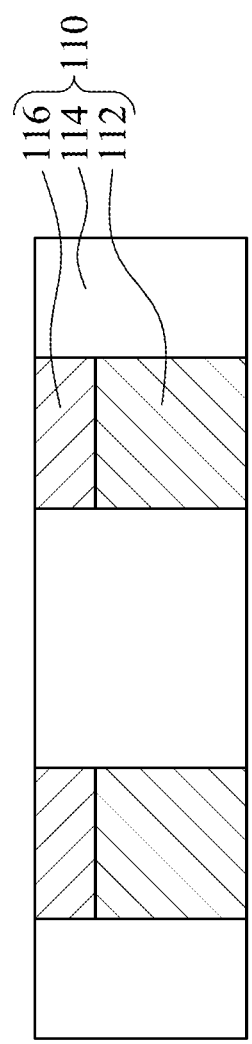
FIGS. 1 to 5 are cross-sectional views of a method of forming a semiconductor structure at various stages in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIGS. 1 to 5 are cross-sectional views of a method of forming a semiconductor structure at various stages in accordance with some embodiments of the present disclosure.

Referring to FIG. 1, a substrate 110 is formed. The substrate 110 has an active region 112, an isolation structure 114 adjacent to the active region 112, and a contact 116 on the active region 112. In some embodiments, the active regions 112 may be made of silicon. The isolation structure 114 may be made of oxide, such as silicon oxide or other suitable material. The isolation structure 114 may be a shallow trench isolation (STI) structure. The contact 116 may be made of a conductive material, such as tungsten (W).

Figure 2:
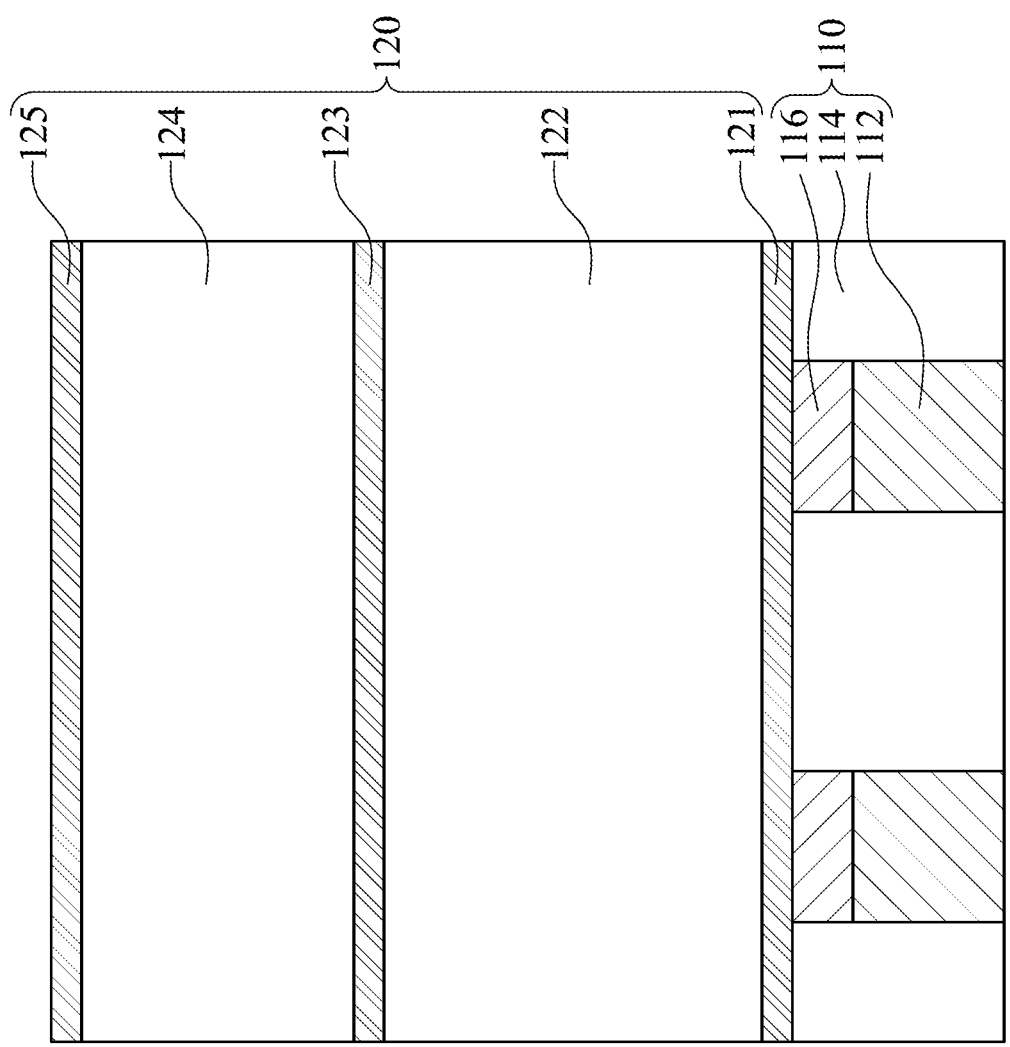

Referring to FIG. 2, a dielectric stack 120 is formed on the substrate 110. The dielectric stack 120 includes a first oxide structure 122 and a second oxide structure 124 over the first oxide structure 122. The dielectric stack 120 further includes a first nitride structure 121 over the substrate 110, a second nitride structure 123 over the first oxide structure 122, and a third nitride structure 125 over the second oxide structure 124. In greater details, the first nitride structure 121, the first oxide structure 122, the second nitride structure 123, the second oxide structure 124, and the third nitride structure 125 are formed in sequence over the substrate 110. In other words, forming the second nitride structure 123 over the first oxide structure 122 is performed such that the first oxide structure 122 is between the first nitride structure 121 and the second nitride structure 123, and forming the third nitride structure 125 over the second oxide structure 124 is performed such that the second oxide structure 124 is between the second nitride structure 123 and the third nitride structure 125. The first nitride structure 121 is in contact with the isolation structure 114 and the contact 116 of the substrate 110. In some embodiments, the dielectric stack 120 is subsequently performed a planarization process, such as a chemical-mechanical polishing (CMP) process.

In some embodiments, the first nitride structure 121, the second nitride structure 123, and the third nitride structure 125 may be made of same materials. For example, the first nitride structure 121, the second nitride structure 123, and the third nitride structure 125 may be made of silicon nitride. In some embodiments, the first oxide structure 122 and the second oxide structure 124 are made of different materials. The first oxide structure 122 may include boron (B), phosphorus (P), or a combination thereof. For example, the first oxide structure 122 is made of borophosphosilicate glass (BPSG), and the second oxide structure 124 is made of tetraethoxysilane (TEOS).

Figure 3:
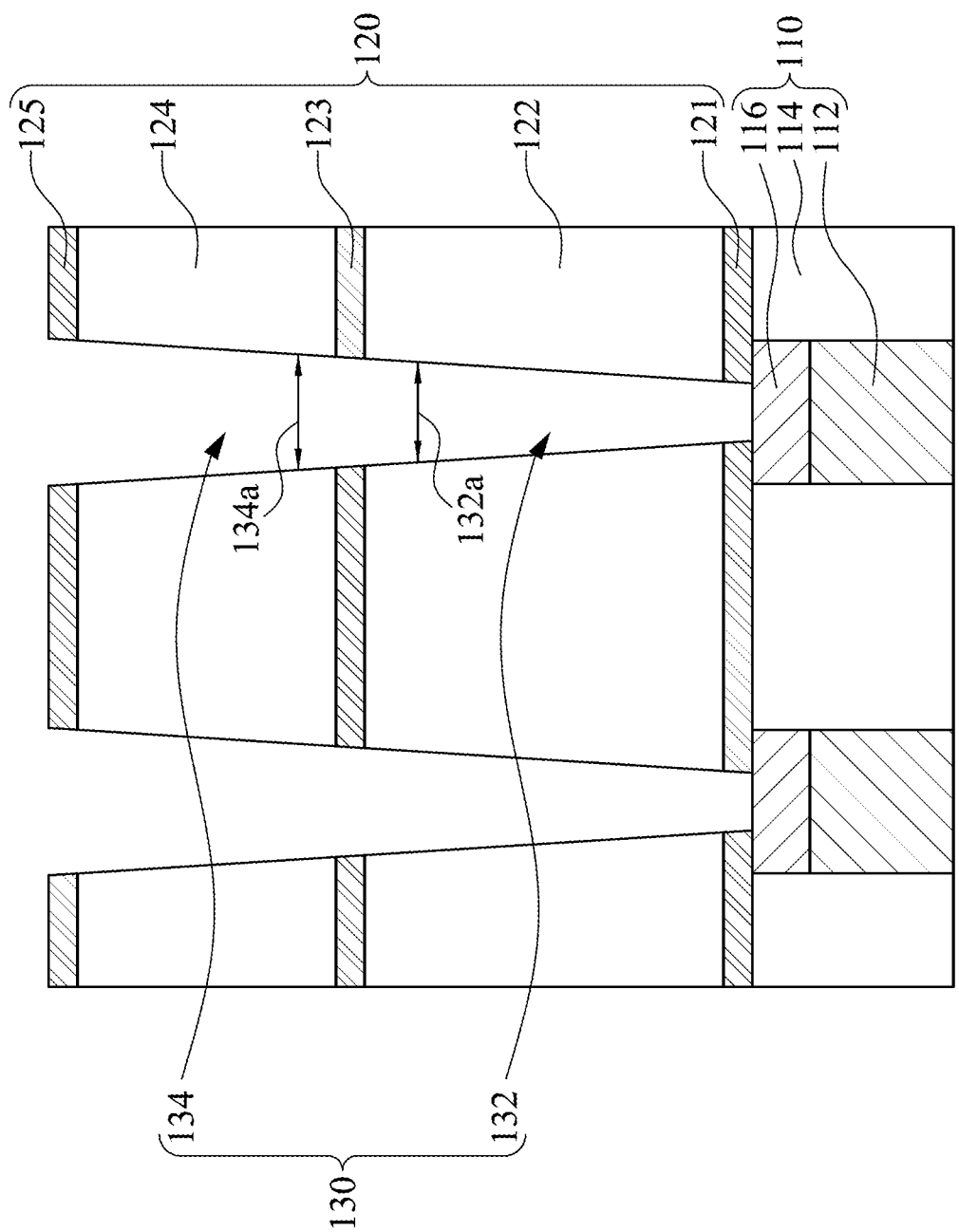

Referring to FIG. 3, the dielectric stack 120 is etched to form an opening 130 such that the contact 116 of the substrate 110 is exposed. The opening 130 has a bottom portion 132 and the top portion 134 communicated to the bottom portion 132. In greater details, the bottom portion 132 of the opening 130 is surrounded by the first oxide structure 122 and the top portion 134 of the opening 130 is surrounded by the second oxide structure 124.

In some embodiments, the bottom portion 132 of the opening 130 is narrower than the top portion 134 of the opening 130. For example, a top region 132a of the bottom portion 132 of the opening 130 is narrower than a bottom region 134a of the top portion 134 of the opening 130.

In some embodiments, etching the dielectric stack 120 to form the opening 130 is performed by a dry etching process. For example, a dry etchant, such as hydrogen ($H_2$) and nitrogen ($N_2$), may be selected for the dry etching process.

Figure 4:
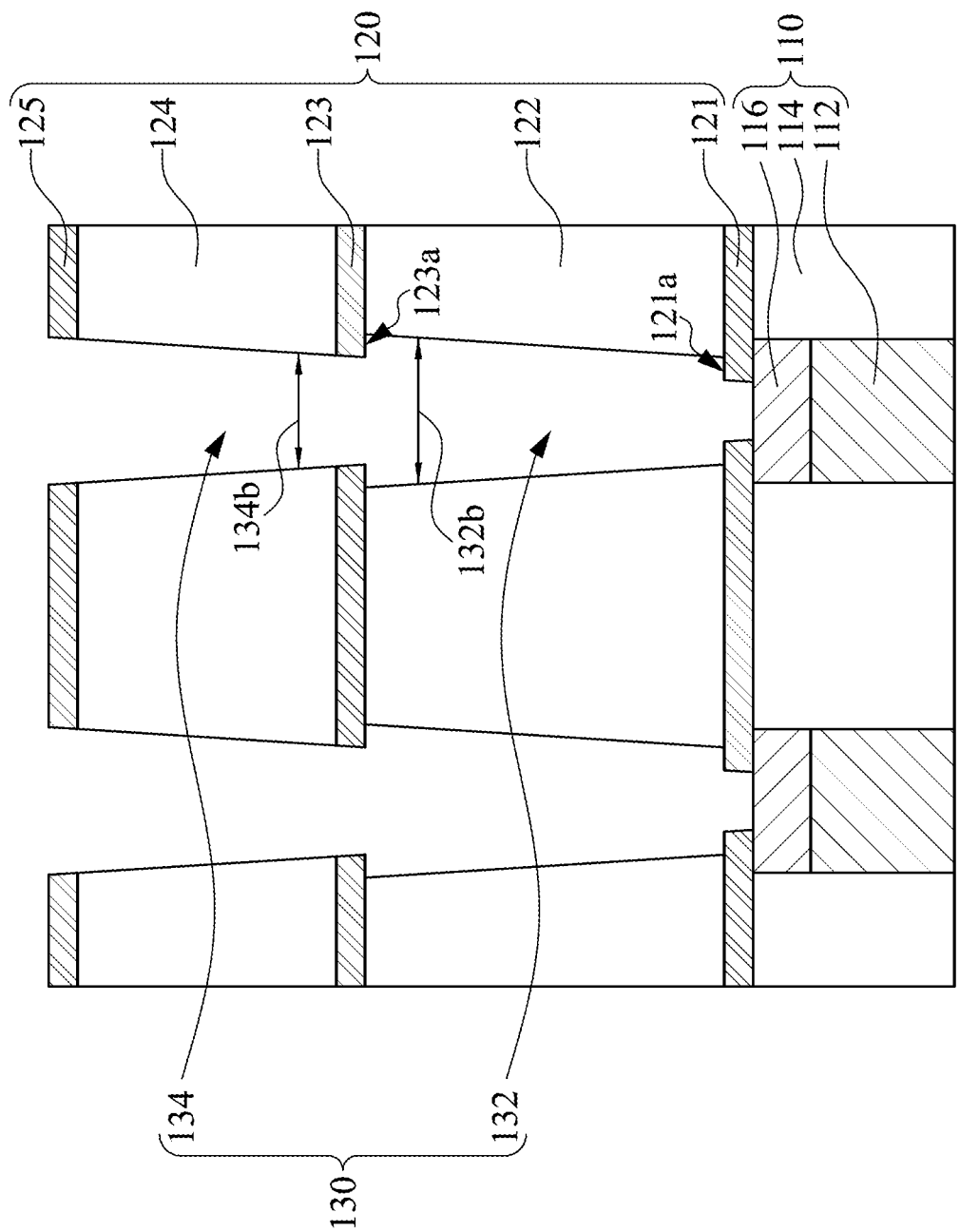

Referring to FIG. 4, the dielectric stack 120 is etched again to expand the bottom portion 132 of the opening 130. In greater details, etching the dielectric stack 120 again to expand the bottom portion 132 of the opening 130 includes etching the first oxide structure 122 of the dielectric stack 120. In other words, etching the dielectric stack 120 again to expand the bottom portion 132 of the opening 130 is performed such that a top region 132b of the bottom portion 132 of the opening 130 is wider than a bottom region 134b of the top portion 134 of the opening 130. As a result of such a process, the size of the opening 130 can be adjusted and thus the problems of under-etch and short-circuit can be avoided.

In some embodiments, the bottom portion 132 of the opening 130 is expanded, while the top portion 134 of the opening 130 is unchanged. In greater details, the top region 132b of the bottom portion 132 of the opening 130 in FIG. 4 is wider than the top region 132a of the bottom portion 132 of the opening 130 in FIG. 3, while the bottom region 134b of the top portion 134 of the opening 130 in FIG. 4 is substantially equal to the bottom region 134a of the top portion 134 of the opening 130 in FIG. 3.

In some embodiments, etching the dielectric stack 120 again may include exposing a top surface 121a of the first nitride structure 121. Further, etching the dielectric stack 120 again may include exposing a bottom surface 123a of the second nitride structure 123. In some embodiments, a slope of a sidewall of the first oxide structure 122 is substantially equal to that of the second oxide structure 124. The expanded opening 130 has a double inverted trapezoid profile.

In some embodiments, etching the dielectric stack 120 again to expand the bottom portion 132 of the opening 130 is performed by a vapor etching process. The vapor etching process may include, for example, an anisotropic etching process using an etching gas has etch selectivity between the first oxide structure 122 and the second oxide structure 124. For example, the etching gas may include hydrogen fluoride (HF). The vapor HF may have a high selectivity etch rate at the first oxide structure 122 by controlling low pressure under flowing nitrogen ($N_2$) and $H_2O$ In other words, the first oxide structure 122 has a higher etch rate in the etching process than the second oxide structure 124, which results in the bottom portion 132 of the opening 130 in the first oxide structure 122 expanded while keeping the top portion 134 of the opening 130 in the second oxide structure 124 substantially intact.

Figure 5:
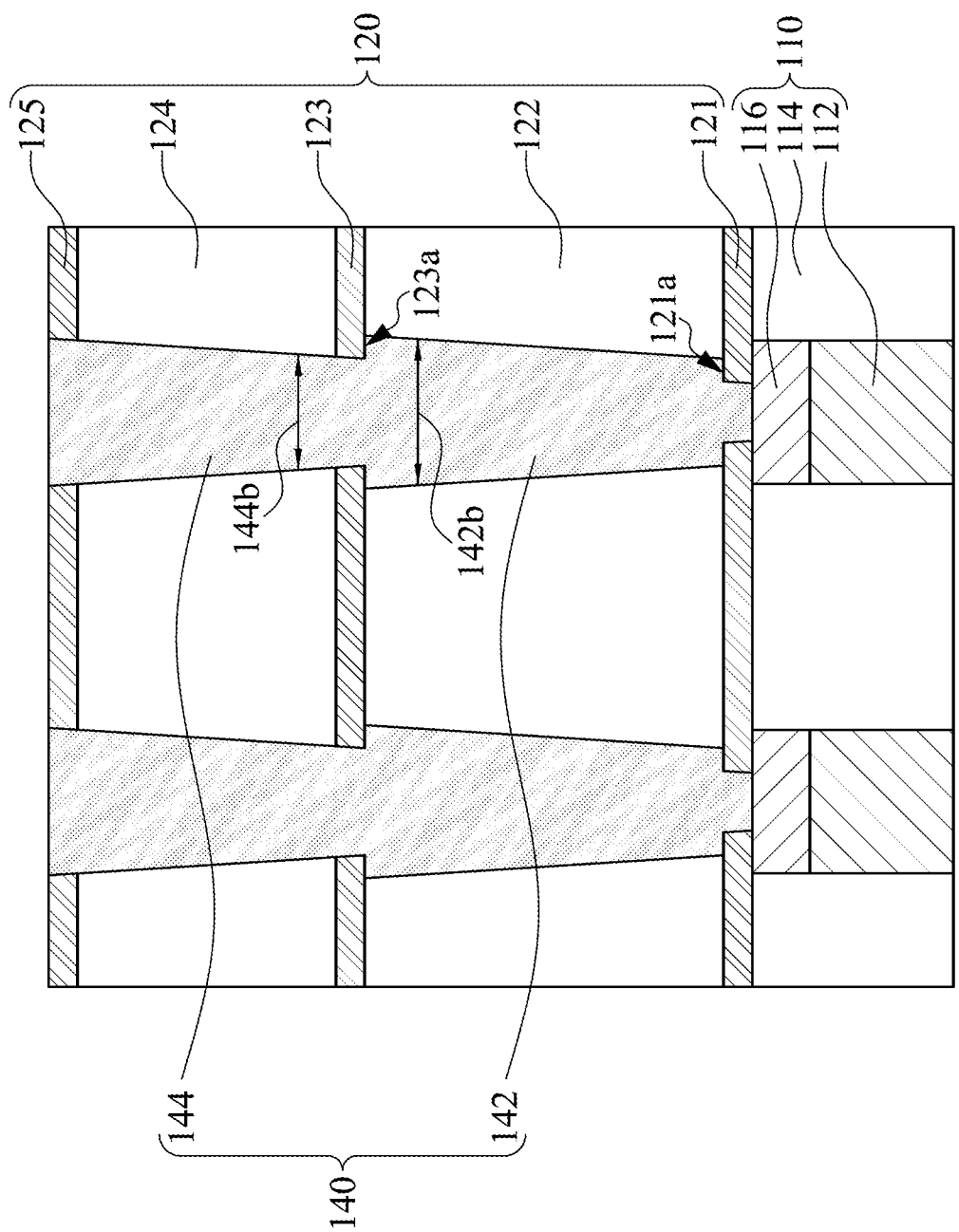

Referring to FIG. 4 and FIG. 5, a conductive material is filled in the opening 130 to form a conductive structure 140. The conductive structure 140 is formed in the dielectric stack 120 and is in contact with the contact 116 of the substrate 110. In greater details, the conductive structure 140 is surrounded by the dielectric stack 120. The conductive structure 140 has a bottom portion 142 and a top portion 144 on the bottom portion 142, and a top region 142b of the bottom portion 142 of the conductive structure 140 is wider than a bottom region 144b of the top portion 144 of the conductive structure 140. The bottom portion 142 of the conductive structure 140 and the top portion 144 of the conductive structure 140 may be integratedly formed as a single piece. In the present embodiments, the conductive structure 140 may be referred as an electrode plate of the capacitor, for example, a bottom electrode plate. As a result of such a configuration, the problems of under-etch and short-circuit can be avoided, and thus the capacitance of the semiconductor structure can be increased and the performance of the semiconductor structure can be also improved.

In some embodiment, the conductive structure 140 may extend from the first nitride structure 121 to the third nitride structure 125. The conductive structure 140 is in contact with the top surface 121a of the first nitride structure 121 and the bottom surface 123a of the second nitride structure 123. In some embodiments, the bottom portion 142 of the conductive structure 140 is surrounded by the first oxide structure 122, and the top portion 144 of the conductive structure 140 is surrounded by the second oxide structure 124.

In some embodiments, because the conductive structure 140 fills the opening 130, the conductive structure 140 inherits the profile of the opening 130. That is, the conductive structure 140 has the double inverted trapezoid profile. In some embodiments, the conductive structure 140 is made of conductive materials, such as titanium nitride (TiN).

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a semiconductor structure, comprising:
    forming a substrate, wherein the substrate has an active region, an isolation structure adjacent to the active region, and a contact on the active region;
    forming a dielectric stack on the substrate, wherein forming the dielectric stack comprises:
        forming a first nitride structure over the substrate;
        forming a first oxide structure over the substrate;
        forming a second nitride structure over the first oxide structure;
        forming a second oxide structure over the first oxide structure; and
        forming a third nitride structure over the second oxide structure;
    etching the dielectric stack to form an opening such that the contact of the substrate is exposed, wherein the opening has a bottom portion and a top portion communicated to the bottom portion; and
    etching the dielectric stack again to expand the bottom portion of the opening.

2. The method of forming the semiconductor structure of claim 1, wherein etching the dielectric stack again to expand the bottom portion of the opening comprises etching the first oxide structure of the dielectric stack.

3. The method of forming the semiconductor structure of claim 1, wherein forming the second nitride structure over the first oxide structure is performed such that the first oxide structure is between the first nitride structure and the second nitride structure.

4. The method of forming the semiconductor structure of claim 1, wherein forming the third nitride structure over the second oxide structure is performed such that the second oxide structure is between the second nitride structure and the third nitride structure.

5. The method of forming the semiconductor structure of claim 1, wherein etching the dielectric stack again to expand the bottom portion of the opening comprises exposing a top surface of the first nitride structure.

6. The method of forming the semiconductor structure of claim 1, wherein etching the dielectric stack again to expand the bottom portion of the opening comprises exposing a bottom surface of the second nitride structure.

7. The method of forming the semiconductor structure of claim 1, wherein the bottom portion of the opening is surrounded by the first oxide structure and the top portion of the opening is surrounded by the second oxide structure, and etching the dielectric stack again to expand the bottom portion of the opening is performed such that a top region of the bottom portion of the opening is wider than a bottom region of the top portion of the opening.

8. The method of forming the semiconductor structure of claim 1, wherein etching the dielectric stack to form the opening is performed by dry etching.

9. The method of forming the semiconductor structure of claim 1, wherein the dielectric stack is etched again using an etching gas comprising hydrogen fluoride (HF).

10. The method of forming the semiconductor structure of claim 1, wherein etching the dielectric stack again to expand the bottom portion of the opening is performed such that the expanded opening has a double inverted trapezoid profile.

11. The method of forming the semiconductor structure of claim 1, further comprising:
    filling a conductive material in the opening to form a conductive structure.

12. The method of forming the semiconductor structure of claim 11, wherein the conductive structure is in contact with the contact of the substrate.

13. A semiconductor structure, comprising:
    a substrate having an action region, an isolation structure adjacent to the active region, and a contact on the active region;
    a dielectric stack on the substrate, wherein the dielectric stack further comprises:
        a first nitride structure over the substrate;
        a first oxide structure over the substrate;
        a second nitride structure over the first oxide structure;
        a second oxide structure over the first oxide structure; and
        a third nitride structure over the second oxide structure; and
    a conductive structure surrounded by the dielectric stack, wherein the conductive structure has a bottom portion and a top portion on the bottom portion, and a top region of the bottom portion of the conductive structure is wider than a bottom region of the top portion of the conductive structure.

14. The semiconductor structure of claim 13, wherein the bottom portion of the conductive structure is surrounded by the first oxide structure, and the top portion of the conductive structure is surrounded by the second oxide structure.

15. The semiconductor structure of claim 13, wherein the first oxide structure is between the first nitride structure and the second nitride structure, and the second oxide structure is between the second nitride structure and the third nitride structure.

16. The semiconductor structure of claim 13, wherein the first oxide structure and the second oxide structure are made of different materials.

* * * * *